(12) United States Patent
Johansson et al.

(10) Patent No.: US 7,623,005 B2
(45) Date of Patent: Nov. 24, 2009

(54) FILTER COMBINER

(75) Inventors: Rune Johansson, Upplands Vasby (SE); Daniel Källberg, Bromma (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 135 days.

(21) Appl. No.: 11/914,016

(22) PCT Filed: May 4, 2006

(86) PCT No.: PCT/SE2006/050099

§ 371 (c)(1),
(2), (4) Date: Dec. 28, 2007

(87) PCT Pub. No.: WO2006/121402

PCT Pub. Date: Nov. 16, 2006

(65) Prior Publication Data

US 2008/0174385 A1    Jul. 24, 2008

(30) Foreign Application Priority Data

May 11, 2005   (SE) .................................. 0501065

(51) Int. Cl.
*H01P 5/12* (2006.01)
*H03H 7/46* (2006.01)
*H01P 1/213* (2006.01)

(52) U.S. Cl. .................. 333/110; 333/117; 333/126
(58) Field of Classification Search .......... 333/109, 333/110, 126, 129, 132
See application file for complete search history.

(56) References Cited

U.S. PATENT DOCUMENTS

| 5,155,724 | A | * | 10/1992 | Edwards | 370/297 |
|---|---|---|---|---|---|
| 5,774,193 | A | | 6/1998 | Vaughan | |
| 6,278,498 | B1 | * | 8/2001 | Neff | 348/723 |
| 6,882,244 | B2 | * | 4/2005 | Stenberg | 333/117 |
| 7,538,634 | B2 | * | 5/2009 | Mallegol | 333/110 |

FOREIGN PATENT DOCUMENTS

| EP | 0520857 A1 | 12/1992 |
|---|---|---|
| EP | 1217733 A1 | 6/2002 |

OTHER PUBLICATIONS

Patent Abstracts of Japan, vol. 200, No. 312, Dec. 5, 2000 & JP 2004056243 A (Nipon Dengyo Kosaku Co Ltd) Feb. 19, 2004 figure 14.

* cited by examiner

*Primary Examiner*—Dean O Takaoka
(74) *Attorney, Agent, or Firm*—Roger S. Burleigh

(57) ABSTRACT

The invention presents a filter combiner, in particular for mobile communications applications, adapted to be connected to an antenna (12), comprising a first directional coupler (13), connected to at least one first filter (15, 15a, 15b), to an antenna branch (12a), to at least one second filter (17, 17a, 17b), and to a first signal branch (20), the combiner also comprising a second directional coupler (21), connected to the at least one first filter (15, 15a, 15b), to a second signal branch (25), and to the at least one second filter (17, 17a, 17b). Further, the first directional coupler (13) is adapted to be connected to the first signal branch (20) via at least one third filter (29, 29a, 29b).

13 Claims, 13 Drawing Sheets

FILTER COMBINER

TECHNICAL FIELD

The present invention relates to a filter combiner, in particular for mobile communications applications, adapted to be connected directly or via other components to an antenna, comprising a first directional coupler, connected to at least one first filter and at least one second filter, and adapted to be connected to an antenna branch, and to a first signal branch, the combiner also comprising a second directional coupler, connected to the at least one first filter and the at least one second filter, and adapted to be connected to a second signal branch.

BACKGROUND

The increasing number of radio services will increase the need for more advanced solutions when it comes to an effective usage of antenna system infrastructure. The most important reason behind is probably economical but there are also other reasons like less visual impact and that many attractive antenna sites are already in use for other/old services.

New radio systems are continuously being developed. When a new system is introduced there is often a must to keep existing system for quite a long period. Existing systems have often attractive sites from both a propagation and capacity perspective making it very cost efficient to reuse as much as possible off existing site infrastructure.

There is also very often a wish to increase capacity off existing sites by adding/using more frequency spectrum. This makes it possible to delay the introduction of more sites and tighter site to site distances as long as extra capacity can be added without too much radio performance degradation. System improvement like advanced frequency hopping or new modulation methods like in WCDMA will also allow more spectrum on each site.

The simplest way and today most common way to solve above problems is to add more and more antennas on existing sites. New antenna technology like having more antennas, dual and even triple band antennas in the same housing has made this solution quite attractive. This solution even if being common is not always possible, typically it will add weight and wind load to the towers not only because of the more and more complex antennas but also because of the need for extra feeders. Feeder sharing is today only easy if different radio frequency bands with large guard-bands are combined. (Like Low band/High band) Adding antennas and feeders will of course also add costs.

If frequency bands or slots with a narrow guard band have to bee combined this can be done in hybrids or similar but these types of solution will introduce high losses making the solution less interesting for sites having a need for both high capacity and high coverage.

There is also a possibility to use what is called filter combiners making it possible to combine specific carriers or frequency bands to a common feeder. This technique has been popular in the past for systems using rather high number off carriers per site/sector. This technique is not that useful if having advanced frequency hopping or frequency bands divided in many small frequency slots having different bandwidths.

Existing band filter combiners are not flexible since they are often hard to retune in frequency and in most case impossible to change in bandwidth. For many operators this means that they have to have a high number off different versions and if there are changes in the spectrum allocation they often have to do replacements or expensive frequency retuning.

Low power combining plus high power amplifiers is another type of solution on the same problem. The complexity of these amplifiers makes a passive filter solution in many cases more attractive if comparing reliability and efficiency. The proposed solution can of course be used together with high power amplifiers. The solution will make it possible to combine these types of amplifiers in an effective way.

Most antenna systems today are using full duplex on the feeders. If using traditional band filter combiners it is necessary to bypass the up-link if the combiner is external to the radio base station.

One very good example showing the complexity to handle different band segments is the PCS 1900 MHz band in North America. It is a lot off band segments, the operators are buying extra slots, and the operators are buying each other sometimes forcing them to sell out a part of the band. A filter combiner not being flexible is quite a bad solution for this scenario.

EP1217733A1 presents a solution for a combination of a narrowband signal with a broadband signal to a common output. The narrowband branch has a passband filter. The design results in the narrowband signal meeting a parallel circuit of the antenna and the broadband branch. In order to not loose effect of the narrowband signal to the broadband branch, a stopband filter is provided on the broadband branch. A disadvantage with the solution in EP1217733A1 is that the lengths of the transmission lines between the respective filters and the interconnection between the narrowband branch and the broadband branch are critical. This makes it very hard to make a broadband solution with high return loss values over wide frequency ranges. The solution in EP1217733A1 is optimised to combine one or many narrow band signals to one more broadband port. This solution is not appropriate to use together with advanced frequency hopping for systems using the narrow band ports since it will give an unrealistic number of different bandpass filter for all used hopping frequencies.

When combining broadband ports with a high number of cavities per filter the tuning becomes very critical because of the critical filter matching via these transmission lines. This is most important for combiners optimised for easy or even remote retuning without having access to advanced instruments like network analysers and skilled personal.

In other words, changing the center frequency of the broadband branch in the solution according to EP1217733A1 will necessitate changing the length of these transmission lines, with in practice is not feasible.

FIG. 1 shows a sketch depicting a solution for broadcast applications. The sketch in FIG. 1 is based on a picture that was retrieved by one of the inventors on Feb. 9, 2005, from the internet-address www.dielectric.com/broadcast/cim.htm. This address was included as a link in a section with the heading "FM Combiners" in the address www.dielectric.com/broadcast/combiner.asp. The latter address mentioned the company Dielectric Communications, in Raymond, Me., USA. The sketch in FIG. 1 contains exactly the same content as the original picture and has been adapted only to meet the formal requirements of this application.

Thus, FIG. 1 shows a so called Constant Impedance Module of a FM Combiner. It can be seen that the module comprises two transmission lines, depicted as horizontal and mutually parallel in FIG. 1. The transmission lines are interconnected by two 3 dB hybrids. Between the hybrids, distributed on each transmission line, FIG. 1 depicts a set of square blocks, which appear to the skilled person, directly and unambiguously, using common general knowledge, as filters.

Referring to FIG. 1, at the right end of the upper transmission line a wideband signal is received, and at the left end of the upper transmission line a signal called F1 is received.

FIGS. 2 and 2a show schematic sketches for depicting the manner in which the module in FIG. 1 works. Referring to FIG. 2, by means of the left hybrid 1, F1 is divided into two signals F1a and F1b, each with half the effect of F1. F1a propagates in the upper transmission line 2 and F1b is sent via the left hybrid 1 to the lower transmission line 3.

When F1a reaches the right hybrid 4, it is divided into two signals F1aa and F1ab, each with half the effect of F1a. F1aa continues towards the wideband input 5 and F1ab is sent via the right hybrid 4 to wideband output 6.

When F1b reaches the right hybrid 4, it is divided into two signals F1ba and F1bb, each with half the effect of F1b. F1bb is sent via the right hybrid 4 towards the wideband input 5 and F1ab continues to wideband output 6.

The skilled person realises, directly and unambiguously, using common general knowledge, that the left hybrid 1 is adapted so that F1b is phase shifted 90° in relation to F1a, and that right hybrid 4 is adapted so that F1bb is phase shifted 90° in relation to F1ba, and therefore, F1bb is phase shifted 180° in relation to F1aa. Since F1bb and F1aa has the same effect, (¼ of the F1 effect), and are phase shifted 180° in relation to each other, they will be eliminated. Thereby, no effect from the F1 signal is sent to the wideband signal source.

Further, F1ab is phase shifted 90° in relation to F1aa, i.e. obtains the same phase as F1ba. Thereby, the signals of F1ab and F1ba will be added when sent to the wideband output 6.

FIG. 2a shows schematically the right part of the module in FIG. 1. By means of the right hybrid 4, a wideband signal W received at the wideband input 5 is divided into two signals Wa and Wb, each with half the effect of W.

Wa propagates in the upper transmission line 2, where a first filter 7 is located. The first filter 7 reflects the signal Wa, the reflected signal being referred to as WaR in FIG. 2a. Wb propagates in the lower transmission line 3, where a second filter 8 is located. The second filter 8 reflects the signal Wb, the reflected signal being referred to as WbR in FIG. 2a.

When WaR reaches the right hybrid 4, it is divided into two signals WaRa and WaRb, each with half the effect of WaR. WaRa continues towards the wideband input 5 and WaRb is sent via to wideband output 6.

When WbR reaches the right hybrid 4, it is divided into two signals WbRa and WbRb, each with half the effect of F1b. WbRb is sent via the right hybrid 4 towards the wideband input 5 and WbRa continues to wideband output 6.

The right hybrid 4 is adapted so that Wb is phase shifted 90° in relation to Wa, so that WaRb is phase shifted 90° in relation to WaRa, and so that WbRb is phase shifted 90° in relation to WbRa. Therefore, WbRb is phase shifted 180° in relation to WaRa. Since WbRb and WaRa has the same effect, (¼ of the W effect), and are phase shifted 180° in relation to each other, they will be eliminated. Thereby, no effect from the W signal is sent back to the wideband signal source. Further, WaRb and WbRa are each phase shifted 90° in relation to W. Thereby, the signals WaRb and WbRa will add in phase when sent to the wideband output 6.

The skilled person realises, directly and unambiguously, using common general knowledge, that a number of hybrid alternatives can be used for the module shown in FIG. 1, including Magic T:s, described for example in "Kompendium i Mikrovågsteknik, Allmän kurs" Institutionen för Mikrovågsteknik KTH, (Royal Institute of Technology, Stockholm, Sweden), which was student literature at KTH in 1975.

The module shown in FIG. 1 is adapted for broadcast transmissions. However, in mobile communications, this solution does not fulfil practical requirements. One reason is that in practice there will always be a mismatch between the combiner and the antenna, which will cause signal reflection from the antenna to the wideband input. More particularly, antennas do not have a constant impedance over used frequency bands. It is possible to fine-tune the impedance for a narrow frequency band but for a wide bandwidth this is not realistic and as a result there will be a mismatch between the characteristic impedance of the feeder system and the antenna. As a result a portion of the energy is reflected back from the antenna. In practice there is also often provided boxes like diplexers or tower-mounted amplifiers in between the combiner and the antenna. These extra boxes will in most cases make the impedance matching even harder.

Another disadvantage with the solution shown in FIG. 1 is that it does not meet the above described need for flexibility regarding frequency retuning, combined with the need for high power levels of the signal (F1 in FIG. 1) transmitted through both hybrids. In particular, the hybrids of the module in FIG. 1 are adapted to provide the desired phase shifts at a certain frequency of the signal transmitted through both of them. If this frequency is changed, the above described phase shifts become not optimal for obtaining the desired elimination of the signal from the combiner to the wideband input. Thus, the solution will not provide full isolation of the wideband input.

The additional need in mobile communication applications for high effect of the signals will add to this problem. In mobile communication applications, it is a requirement that any unwanted signal leakage from one input port to another input port must low enough over the whole used frequency band. This requirement is also important to fulfil together with rather bad return loss for the components connected to the different ports. Signal leakage is critical because it will typically result in unwanted frequency generation when two or more frequency bands are mixed because of unlinearities.

SUMMARY

The object of the invention is to provide a combiner that has a high level of isolation between the combined bands.

Another object of the invention is to provide a combiner at which it is easy to retune the at least one frequency of at least one of the combined bands, while retaining a high level of isolation between the bands.

Another object of the invention is to provide a combiner at which it is possible allow relatively high signal effects, while retaining a high level of isolation between the bands even if the impedance matching is not being perfect on all combiner ports.

A further object of the invention is to increase the level of isolation between the combined bands in a combiner with a hybrid/filter combination as shown in FIG. 1.

Another object of the invention is, in a combiner with a hybrid/filter combination as shown in FIG. 1, to make it possible to easily retune the at least one frequency of at least one of the combined bands, while retaining a high level of isolation between the bands.

Another object of the invention is, in a combiner with a hybrid/filter combination as shown in FIG. 1, to make it possible allow relatively high signal effects, while retaining a high level of isolation between the bands even if the impedance matching is not being perfect on all combiner ports.

These objects are reached with a filter combiner of the type mentioned initially, wherein the first directional coupler is adapted to be connected to the first signal branch via at least one third filter.

Thereby, parts of TX (transmission) signals from the second signal branch, reflected from the antenna will be prevented from progressing through the first signal branch. Further, the filter on the first second signal branch will be able to prevent parts of TX signals from progressing through the first signal branch in the case where the filter/directional coupler combination is less than optimal and "leaks" to the first second signal branch. Thus, the invention increases the level of isolation between the combined bands, also in situations where frequencies are retuned and/or where relatively high signal effects are allowed to pass through the combiner. The invention provides for a high flexibility, a low loss combining, and a high power handling capability.

Superimposed on the feeders from a base station to the antennas is often a DC signal and different types of low frequency signalling, (for example to control mast mounted amplifiers and or remote electrical tilt antennas). If the first and second filters are band pass filters and the third filter is a band reject filter, the combiner is easy to build with this DC and/or signalling path via the couplers and via the band reject filter.

Also, the invention provides signal paths going in opposite direction making it possible to use the signal path for broadband full duplex applications without additional filters. This signal path can be made without sharp filters reducing the overall group delay distortion which is of major importance to reduce problem with phase distortion for certain types of wideband modulation. Thus, the invention provides for a full duplex broadband port.

The absence of critical transmission line lengths etc, for tuning the frequencies of the bands of the combiner makes it possible for easy retuning of radio base stations on site, and even makes it possible to easily provide for a remote retuning arrangement. Also, because the filters in the combiner according to the invention can have known generator and load impedances, they are much easier to retune to a new frequency band.

Further, the invention makes it possible to design for low passive intermodulation, i.e. no circulators are needed to provide the wanted port to port isolation.

Additionally, the invention can be used in all types of radio technologies where there is a need for low loss RF combining, (i.e. adding an extra WCDMA carrier on an existing WCDMA antenna system). In particular, the invention is easy to use in already existing installations since it is very independent of the type of radio base station used. More particularly, the invention fits very well to duplex base stations.

Of course, the solution according to the invention can be used to combine multi carrier power amplifiers.

Preferably, the first directional coupler and the second directional coupler are hybrids.

Preferably, for example as shown in FIG. 3a, further described below, the first and second filters are bandpass filters, and the third filter is a band reject filter.

Alternatively, for example as shown in FIG. 10, further described below, the first and second filters are band reject filters, and the third filter is a bandpass filter.

Preferably, for example as shown in FIG. 6, further described below, a fourth filter is provided at the second directional coupler. In case the first and second filters are bandpass filters, the second branch comprises a TX sub-band port, and the fourth filter is a bandpass filter, RX fullband signals can be received through the fourth filter so that RX signals can be easily added to the second branch. Further, the first signal branch can be connected to a first radio base station, which in turn is connected to the fourth filter, the second signal branch being connected to a second radio base station. Thereby, fullband RX signals received by the first radio base station through the first signal branch can be transmitted to the second radio base station via the fourth filter.

Preferably, for example as shown in FIG. 7, further described below, the first directional coupler, the first filter, the second filter, the second directional coupler, and the third filter, are included in a first combiner assembly, the filter combiner further comprising a second combiner assembly comprising a first directional coupler connected to at least one first filter, at least one second filter, and at least one third filter, and adapted to be connected to the antenna branch, the second combiner assembly also comprising a second directional coupler connected to the at least one first filter and the at least one second filter, and adapted to be connected to a third signal branch, the first directional coupler of the first combiner assembly being connected to the at least one third filter of the second combiner assembly.

Of course, further combiner assemblies can be provided. In can be understood that one of the large merits of the invention is that bands can be combined without the need for complicated adaptation of transmission line lengths where the bands are joined.

Preferably, for example as shown in FIG. 9, further described below, the combiner comprises a fourth filter at the second directional coupler of the first combiner assembly, and a fourth filter at the second directional coupler of the second combiner assembly, the first signal branch being connected to a first radio base station, which in turn is connected to the fourth filter of the first combiner assembly, and the second signal branch being connected to a second radio base station, in addition to which the first radio base station is connected to the fourth filter of the second combiner assembly, the third signal branch being connected to a third radio base station.

Of course additional base stations can be combined in this manner. Fullband RX signals received by the first radio base station through the first signal branch can be transmitted to the second radio base station and a third radio base station via the fourth filter of the first combiner assembly and the second combiner assembly, respectively. Preferably, for example as shown in FIG. 11, further described below, the combiner comprises two first filters in the form of bandpass filters, two second filters in the form of bandpass filters, and two third filters in the form of bandreject filters, one of the first filters, one of the second filters, and one of the third filters being tuned to a band between two RX frequencies, and another of the first filters, another of the second filters, and another of the third filters being tuned to a band between two TX frequencies. Thereby, the first signal branch becomes a RX fullband branch excluding frequencies between f1RX and f2RX, and a TX fullband branch excluding frequencies between f1TX and f2TX. in addition to which the second signal branch becomes a RX branch including frequencies between f1RX and f2RX, and a TX branch including frequencies between f1TX and f2TX.

Preferably, for example as shown in FIG. 14, further described below, the combiner comprises two first filters in the form of bandreject filters, two second filters in the form of bandreject filters, and two third filters in the form of bandpass filters, one of the first filters, one of the second filters, and one of the third filters being tuned to a band between two RX frequencies, and another of the first filters, another of the second filters, and another of the third filters being tuned to a band between two TX frequencies.

Thereby, the first signal branch becomes a RX branch including frequencies between f1RX and f2RX, and a TX branch including frequencies between f1TX and f2TX, in addition to which the second signal branch becomes a RX fullband branch excluding frequencies between f1RX and f2RX, and a TX fullband branch excluding frequencies between f1TX and f2TX.

Preferably, for example as shown in FIG. 15, further described below, the combiner comprises two first filters, two second filters and two third filters, one of the first filters and one of the second filters being band reject filters tuned to a band between two TX frequencies, and another of the first filters and another of the second filters being bandpass filters tuned to a TX fullband, in addition to which one of the third filters is a bandpass filter tuned to a band between the two TX frequencies, and another of the third filters is a bandpass filter tuned to the RX fullband.

This embodiment has the advantage that, in addition to the second signal branch being a TX fullband branch excluding frequencies between f1TX and f2TX, the first signal branch can be used as a part band port for TX signals, while serving as a fullband port for RX signals.

The invention also relates to filter combiner of the type mentioned initially, comprising, for example as shown in FIG. 16, 18, 20, 22, further described below, two first filters and two second filters, one of the first filters and one of the second filters being tuned to a band between a first and a second TX frequency, and another of the first filters and another of the second filters being tuned to a band between a third and a fourth TX frequency, the interval between the first and the second TX frequency and the interval between the third and the fourth TX frequency overlapping each other at least partially. By providing filters with overlapping frequency intervals in this manner, a variable bandwidth is provided in the combiner. This should be seen in view of it being, as is known in the art, very complicated to make a filter with variable bandwidth. According to this aspect of the invention, simply by adjusting the center frequencies of the filters, the bandwidth of the filter combination can be easily adjusted.

It should be noted that this aspect of the invention, providing variable bandwidths, can be used in a combiner with a plurality of combiner assemblies, as described above and below with reference to FIG. 7.

In one embodiment, for example as shown in FIG. 16, 18, further described below, the first filters and the second filters are bandpass filters. This will result in a bandwidth of the second branch between the second frequency and the third frequency. In a further embodiment, for example as shown in FIG. 20, 22, further described below, the first filters and the second filters are bandreject filters. This will result in a fullband at the second branch excluding frequencies between the first frequency and the fourth frequency. In either of these embodiments, simply by adjusting the center frequencies of the filters, the width of the band can be adjusted. As mentioned, it is very complicated to make a filter with variable bandwidth. It is much easier to adjust the center frequency of a filter. Thus, the invention can provide an effective solution to the problem of providing a variable bandwidth in a combiner.

According to one specific embodiment, for example as shown in FIG. 18, further described below, the first filters and the second filters are bandpass filters, and the filter combiner comprises two third filters, the first directional coupler being adapted to be connected to the first signal branch via the third filters, the third filters being band reject filters, one of the third filters being tuned to a band between the third frequency and a fifth frequency, and another of the band reject filters being tuned to a band between a sixth frequency and the second frequency, the interval between the third frequency and the fifth frequency, and the interval between the sixth frequency and the second frequency overlapping each other at least partially.

Thereby, frequencies between f3 and f2, i.e. the same interval admitted at the second branch, will be rejected at the first branch. This will increase the isolation to the first branch 20. Further, this embodiment has the advantage that the bandwidth of the combination of band reject filters can be adjusted.

According to one specific embodiment, for example as shown in FIG. 22, further described below, the first filters and the second filters are band reject filters, and the filter combiner comprises two third filters, the first directional coupler being adapted to be connected to the first signal branch via the third filters, the third filters being bandpass filters, one of the third filters being tuned to a band between a fifth frequency and the fourth frequency, and another one of the band reject filters being tuned to a band between the first frequency and a sixth frequency, the interval between the fifth frequency and the fourth frequency, and the interval between the first frequency and the sixth frequency overlapping each other at least partially.

Thereby, frequencies between f1 and f4, i.e. the same interval rejected at the second branch, will be admitted at the first branch.

The invention also relates to a splitter assembly, for example as shown in FIG. 24, further described below, comprising a first directional coupler and a second directional coupler, both connected to at least one first filter and at least one second filter, the first directional coupler being adapted to be connected to a first antenna branch via a third filter, and the second directional coupler being adapted to be connected to a second antenna branch.

Thereby, the first and second filters can be arranged as bandpass filters and the third filter can be arranged as a band reject filter, all tuned to a frequency band of f1 to f2. Thereby, the first antenna branch will receive TX fullband signals except for frequencies in the interval f1 to f2, and the second antenna branch will receive TX frequencies in the interval f1 to f2. Of course, alternatively, the first filter and the second filter can be band reject filters, and the third filter can be a band pass filter, so that the first antenna branch will receive TX frequencies in the interval f1 to f2, and the second antenna branch will receive TX fullband signals except for frequencies in the interval f1 to f2.

DESCRIPTION OF DRAWINGS

Below, the invention will be described in greater detail, with the aid of the drawings, in which.

DETAILED DESCRIPTION

Figure 1:
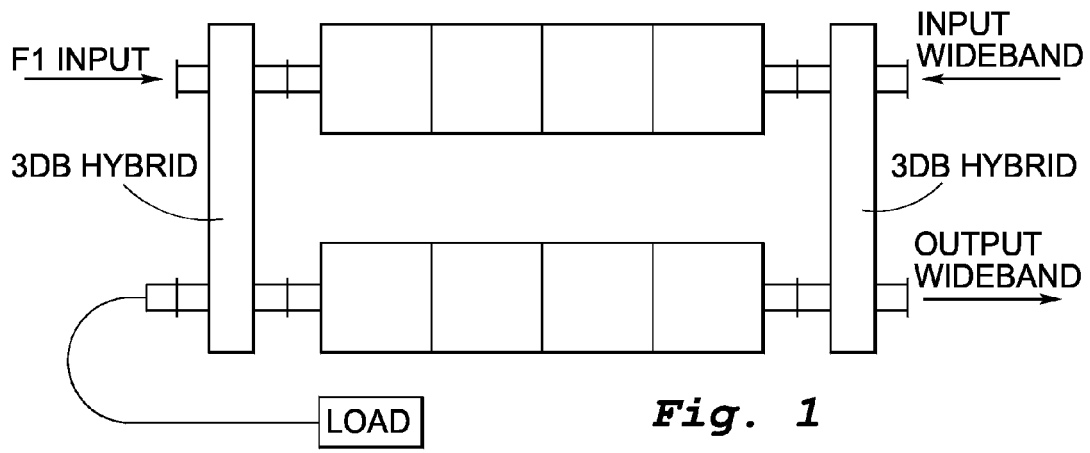
FIG. 1 shows a sketch of a solution according to known art, described above.
Figure 2:
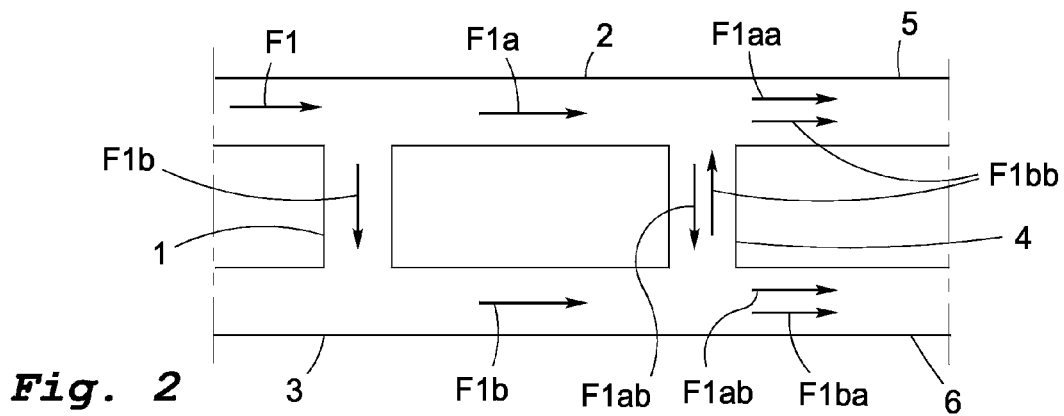
FIGS. 2 and 2a show schematic sketches depicting the function of the solution in FIG. 1.
Figure 2A:
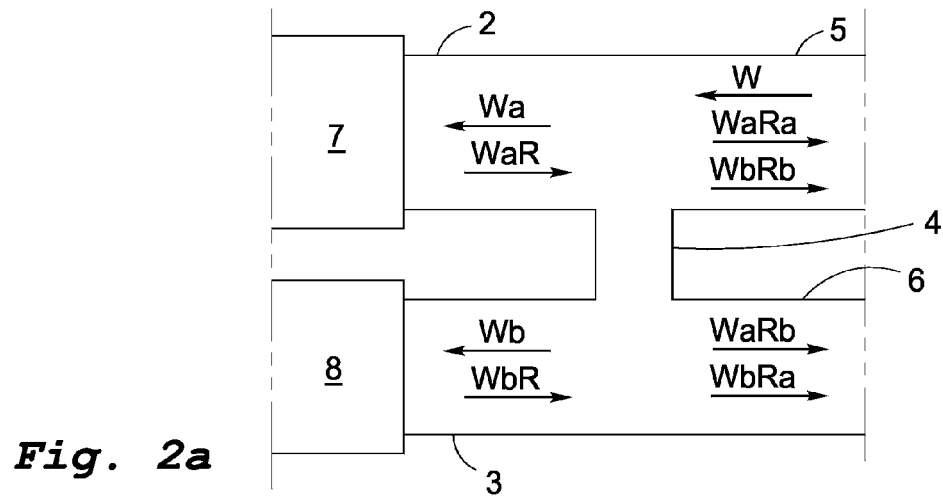
Figure 3:
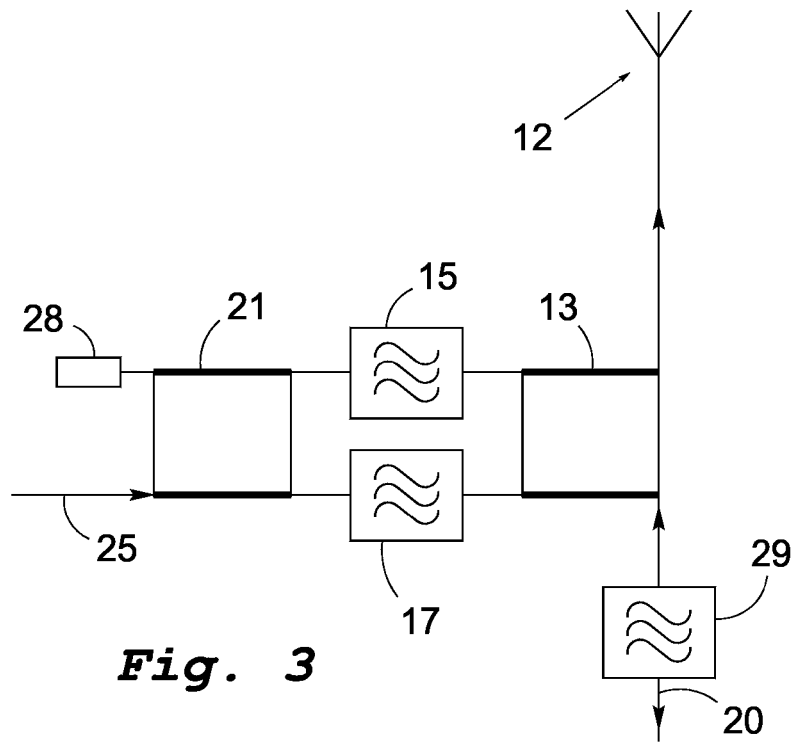
FIG. 3 shows a sketch of a solution according to an embodiment of the invention.

FIG. 3 shows a sketch of a filter combiner according to a first embodiment according to the invention. In this example, the filter combiner is connected directly to an antenna 12, but it can of course alternatively be connected to an antenna via other components. The filter combiner comprises a first directional coupler 13 in the form of a hybrid, here referred to as a first hybrid 13. The first hybrid 13 is connected to a first filter 15 and to the antenna branch 12a. Further, the first hybrid 13 is connected to a second filter 17 and a first signal branch 20.

The combiner also comprises a second directional coupler 21, in the form of a hybrid, here referred to as a second hybrid 21. The second hybrid 21 is connected to the first filter 15, and a second signal branch 25. Further, the second hybrid 21 is connected to the second filter 17 and to a load 28. This load will terminate reflected energy because of any non-perfect signal matching in the filters 15, 17 and any non-perfect isolation in the hybrid 21.

In addition, the first hybrid 13 is connected to the first signal branch 20 via a third filter 29.

In greater detail, the first directional coupler 13 comprises a first feed attachment 14 connected to the at least one first filter 15, a second feed attachment 18 adapted to be connected to an antenna branch 12a, a third feed attachment 16 connected to the at least one second filter 17, 17a, 17b, and a fourth feed attachment 19 adapted to be connected to the first signal branch 20, the second directional coupler 21 comprises a second feed attachment 22 connected to the at least one first filter 15, 15a, 15b, a third feed attachment 25 adapted to be connected to the second signal branch 25, and a fourth feed attachment 23 connected to the at least one second filter 17, 17a, 17b, and the fourth feed attachment 19 of the first directional coupler 13 is adapted to be connected to the first signal branch 20 via the at least one third filter 29, 29a, 29b. A first feed attachment 27 of the second hybrid 21 is connected to the load 28.

Figure 3A:
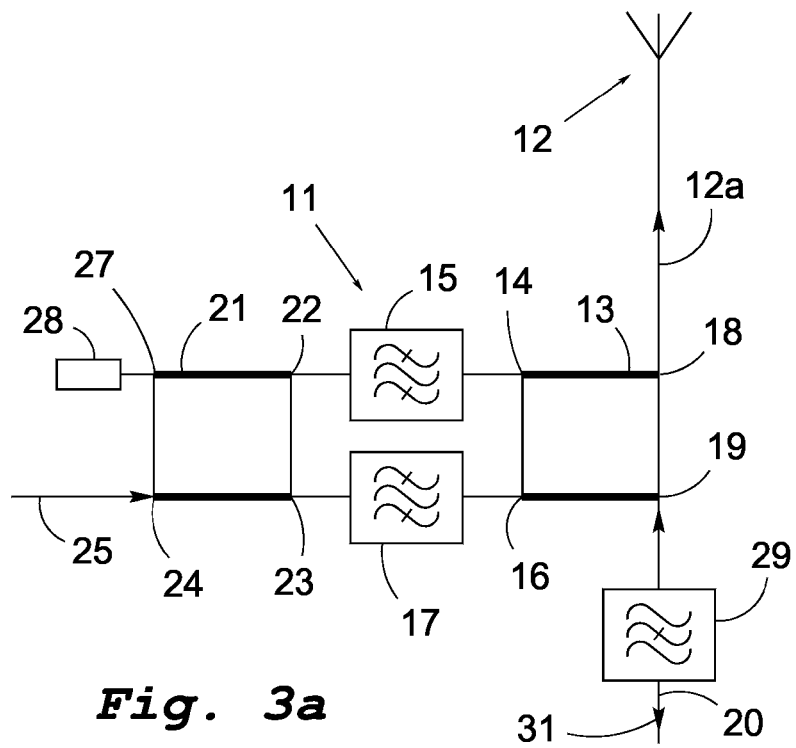
FIG. 3a-3c show sketches of solutions based on the embodiment shown in FIG. 3.
Figure 4:
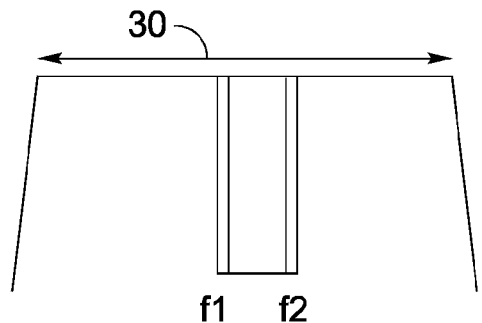
FIG. 4 shows a diagram of the frequency distribution of the signals in the embodiment in FIG. 3a, FIG. 5 shows a sketch of a solution similar to the one shown in FIG. 3a, but with an added application.

FIG. 3a shows a sketch of a more specific filter combiner based on the combiner shown in FIG. 3. In this embodiment the third filter 29 is a band reject filter tuned a band between f1 and f2. Referring also to FIG. 4, in this embodiment a TX (transmission) wide frequency band (full band, indicated with the double arrow 30) can be transmitted through the first signal branch 20, excluding the frequencies between f1 and f2. The first and second filters 15, 17 are bandpass filters tuned a band between f1 and f2. Thereby a TX band of f1 to f2 can be transmitted through the second signal branch 25. Thus, the second signal branch 25 forms a sub-band TX port.

The invention covers not only the TX band but also the RX (reception) band without the need for any extra filters to the first signal branch 20. This is indicated in FIG. 3a with the arrow 31. Specifically, an RX signal received by the antenna 12 passes through the second feed attachment 18 and the fourth feed attachment 19 of the first hybrid 13, to the first branch 20. The RX signal passes the first hybrid 13 in this way, since the bandpass filters 15, 17 are totally mismatched to the frequency band of the RX signal. Since the TX and the RX signals are using one and the same feeder the solution fits very well to standard duplex radio base stations.

Below, with reference to FIG. 10 an embodiment is described, in which the arrangement of bandpass and band reject filters are "inverted" compared to the embodiment in FIG. 3a.

Figure 3B:
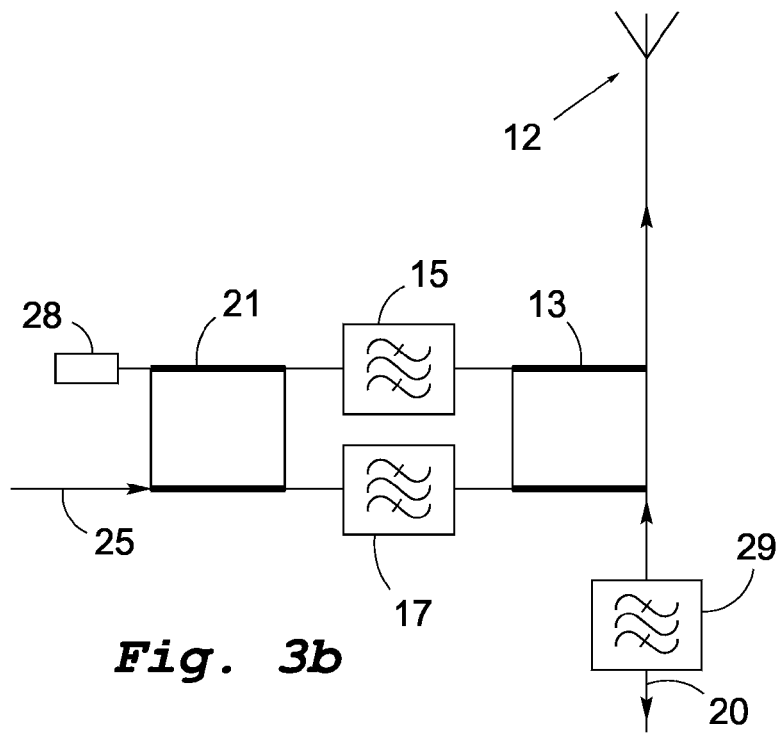

FIG. 3b shows a sketch of another more specific filter combiner based on the combiner shown in FIG. 3. In this embodiment the first, second and third filter 15, 17, 29 are all bandpass filters. The first and second filters 15, 16 are tuned a band between the frequencies f1 and f2, and the third filter 29 is tuned a band between the frequencies f3 and f4, outside the band of the first and second filters.

Figure 3C:
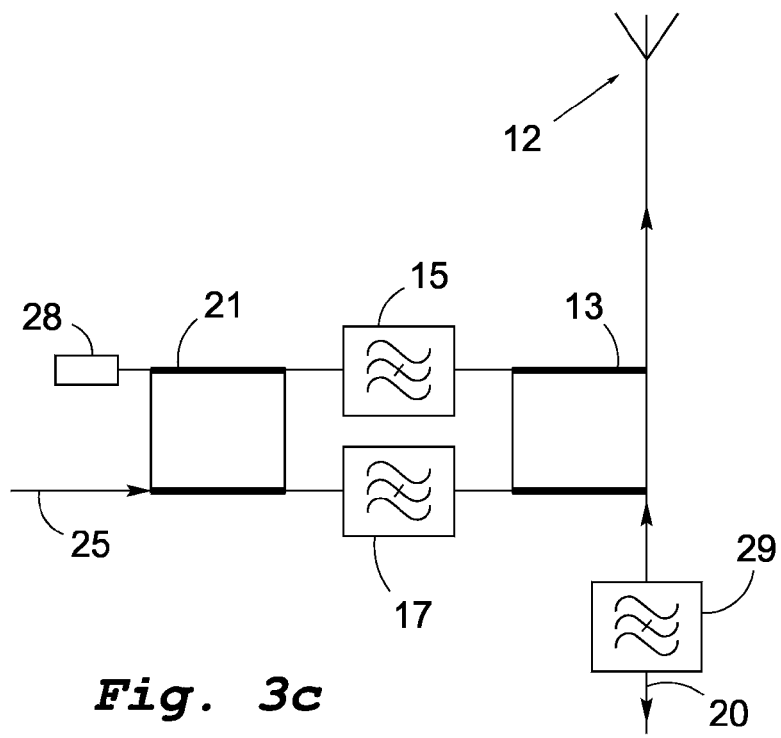

FIG. 3c shows a sketch of a further more specific filter combiner based on the combiner shown in FIG. 3. In this embodiment the first, second and third filter 15, 17, 29 are all band reject filters. The first and second filters 15, 16 are tuned a band between the frequencies f1 and f2, and the third filter 29 is tuned a band between the frequencies f3 and f4, outside the band of the first and second filters. In this embodiment it is also possible to obtain an RX path to the second signal branch 25.

Figure 5:
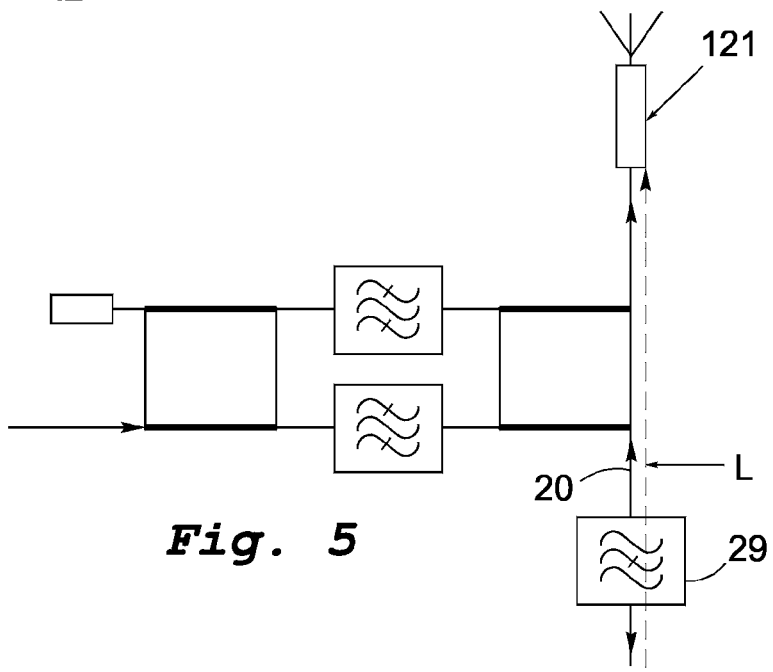

FIG. 5 shows a special embodiment of the invention. The combiner in FIG. 5 is similar to the one shown in FIG. 3a. The dotted line L indicates a signal superimposed on other signals from the first branch 20. The signal L is adapted to control a mast mounted amplifier 121. In general, a configuration, such as the ones shown in FIGS. 3a and 5 allow DC signals and/or different types of low frequency signalling are superimposed on the feeders from the base station to the antennas, (for example to control mast mounted amplifiers and/or remote electrical antenna tilt). The third filter 29 being a bandreject filter which is easy to design for such a path of DC signals and/or different types of low frequency signalling, allows for a simple implementation of such an application.

Figure 6:
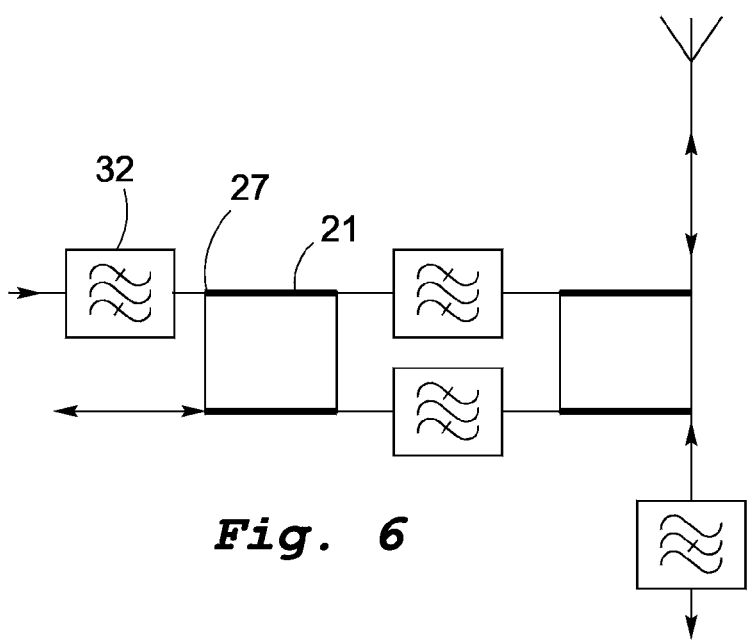
FIG. 6 shows a sketch of a solution according to a further embodiment of the invention.
Figure 9:
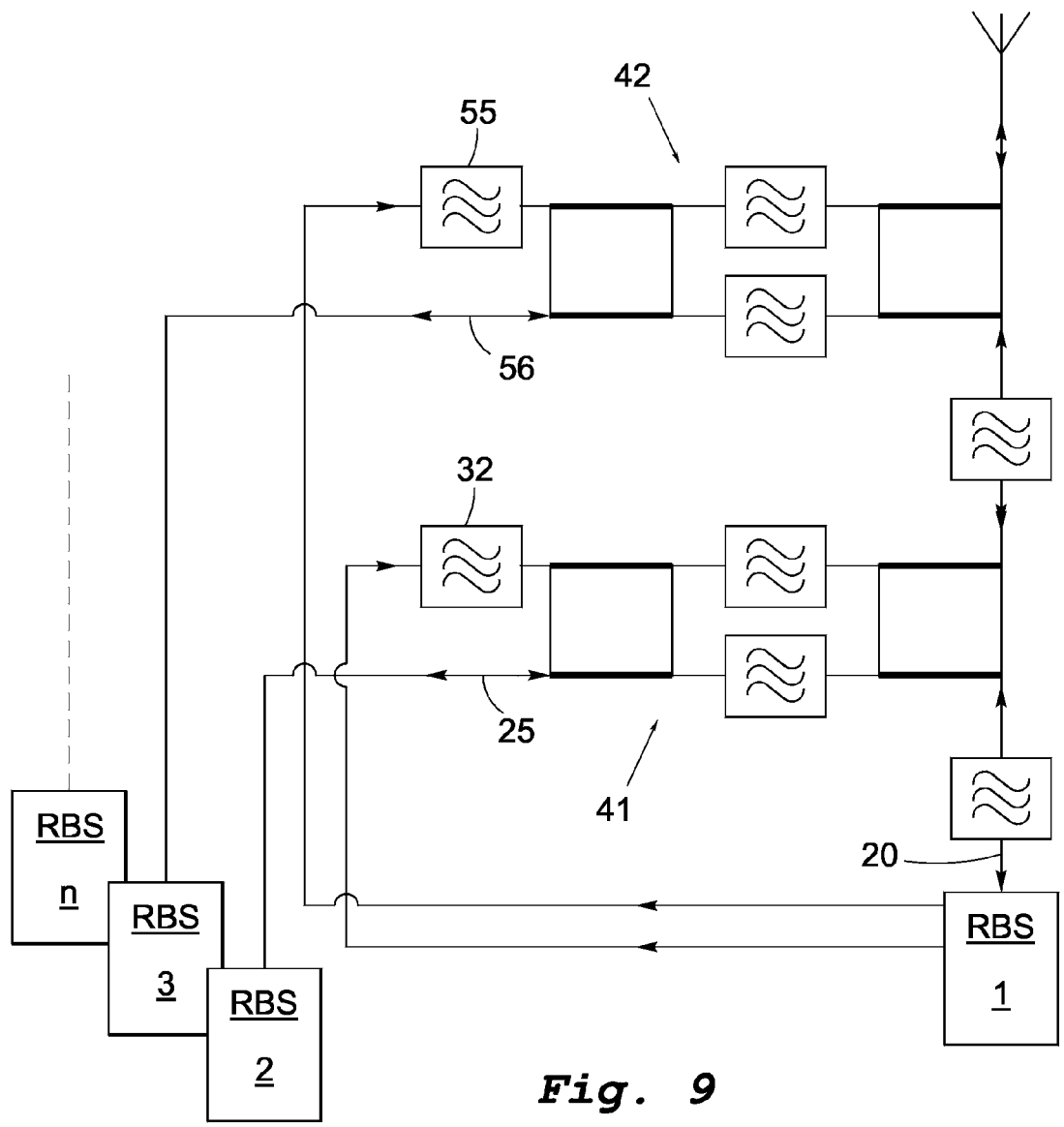
FIG. 9 shows a sketch the embodiment in FIG. 7 included in a system with a plurality of radio base stations.

FIG. 6 shows an embodiment similar to the one shown in FIG. 3a. The embodiment in FIG. 6 shows that RX signals can be easily added to the sub-band TX port. Similar to the embodiment in FIG. 3a, this embodiment presents a filter combiner comprising a first hybrid 13 and a second hybrid 21. RX fullband signals, provided for example in a manner described below with reference to FIG. 9, are received through a fourth filter 32, which is a band pass filter tuned a band between f1 and f2 and provided at a first feed attachment 27 of the second hybrid 21.

Figure 7:
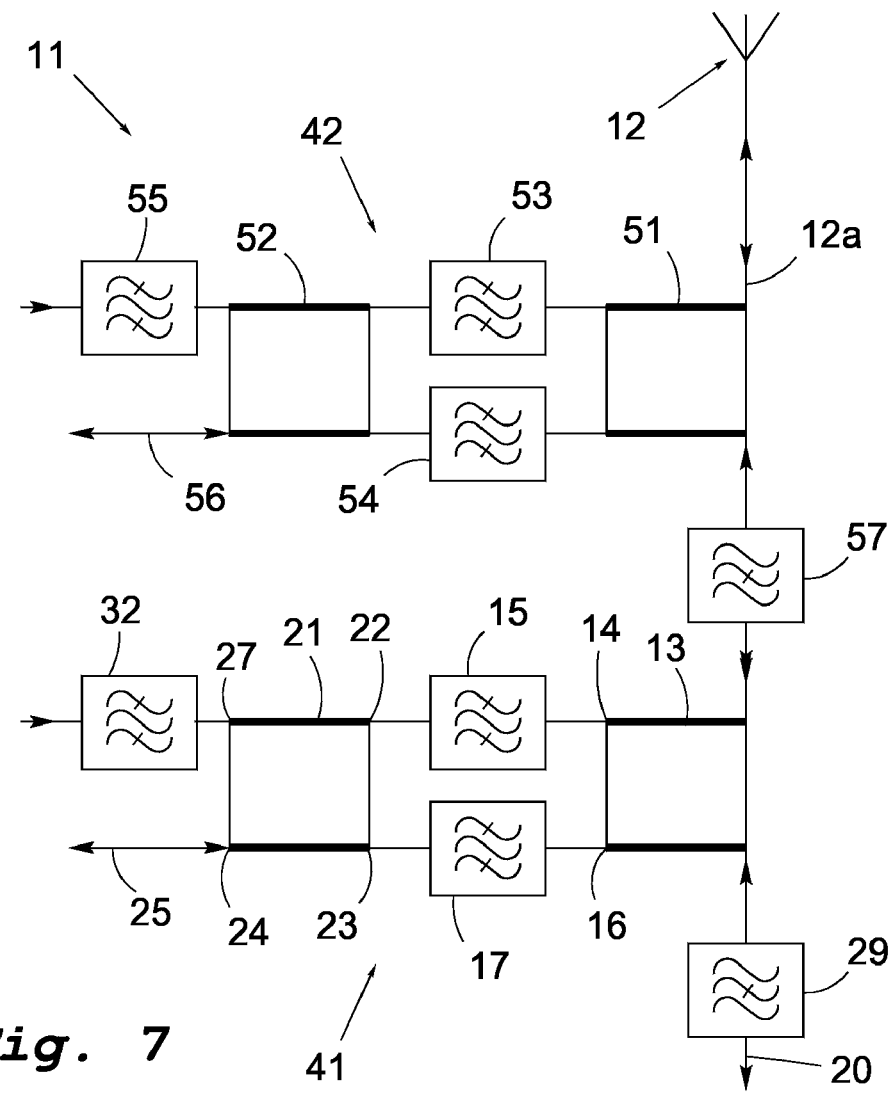
FIG. 7 shows a sketch of a solution according to another embodiment of the invention.

FIG. 7 shows a further embodiment of the invention. A filter combiner 11 comprises a first combiner assembly 41 and a second combiner assembly 42. These combiner assemblies are provided in a cascade arrangement between an antenna 12 and a first signal branch 20.

The first combiner assembly 41 is arranged similarly to the filter combiner 11 in FIG. 6, with a first hybrid 13 connected to a first filter 15, a second filter 17 and third filter 29, and a second hybrid 21 connected to the first filter 15, the second filter 17, a second signal branch 25, and a fourth filter 32. The first and second filters 15, 17 are bandpass filters tuned a band between f1 and f2. The third filter 29 is a band reject filter and the fourth filter 32 is a band pass filter tuned the RX band.

The second combiner assembly 42 is similar to the first combiner assembly, but tuned to another frequency band, f3-f4. It comprises a first hybrid 51 and a second hybrid 52, both connected to a first filter 53 and a second filter 54, both bandpass filters tuned to the frequency band f3-f4. The second hybrid 52 is connected to a fourth filter in the form of a band pass filter 55 tuned to the RX band, and a third signal branch 56, similar to the first combiner assembly 41. Thus, the first hybrid 51 of the second combiner assembly 42 is connected to the antenna branch 12a and the first signal branch 20 via a third filter 57, the first hybrid 13 of the first combiner assembly 41 the third filter 29 of the first combiner assembly 41. The third filter 57 is a band reject filter tuned a band between f3 and f4.

More specifically, the second combiner assembly 42 comprises a first directional coupler 51, in turn comprising a first feed attachment connected to the at least one first filter 53, a second feed attachment adapted to be connected to the antenna branch 12a, a third feed attachment connected to the at least one second filter 54, and a fourth feed attachment connected to the at least one third filter 57, the second combiner assembly 42 also comprising a second directional coupler 52, in turn comprising a second feed attachment connected to the at least one first filter 53, a third feed attachment adapted to be connected to the third signal branch 56, and a fourth feed attachment connected to the at least one second filter 54, whereby the second feed attachment 18 of the first directional coupler 13 of the first combiner assembly 41 is connected to the third filter 57 of the second combiner assembly 42.

Figure 8:
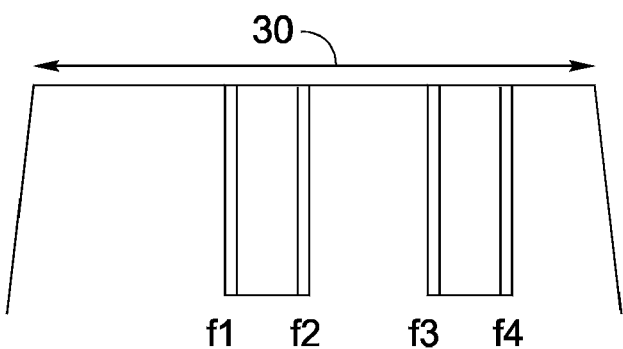
FIG. 8 shows a diagram of the frequency distribution of the signals in the embodiment in FIG. 7.

Referring to FIG. 8, a TX band of f1 to f2 can be transmitted through the second signal branch 25, and a TX band of f3 to f4 can be transmitted through the third signal branch 56. A TX wide frequency band (full band, indicated with the double arrow 30) can be transmitted through the first signal branch 20, excluding frequencies between f1 and f2, and frequencies between f3 and f4. Also, RX fullband signals can be transmitted to any of the signal branches 20, 25, 56, as explained closer below with reference to FIG. 9.

Thus, the invention covers embodiments presenting more than one sub-band. Thereby, more than two combiner assemblies similar to the ones described above, and each tuned to their respective frequency band, can be added to the filter combiner in a cascade arrangement similar to what has been described in conjunction with FIGS. 7 and 8. The embodiment in FIG. 7 shows one of the large merits of the invention, namely that many bands can be combined without the need for complicated adaptation of transmission line lengths where the bands are joined.

FIG. 9 depicts the embodiment in FIG. 7 used in a system to combine a number of radio base stations RBS1, RBS2, RBS3, . . . , RBSn using different parts of the spectrum for TX. The RX signal going to all base stations can easily be made broadband. The fullband RX signals received by a first radio base station RBS1 through the first signal branch 20 can be transmitted to a second radio base station RBS2 and a third radio base station RBS3 via the fourth filter 32, 55 of the first combiner assembly 41 and the second combiner assembly 42, respectively. More specifically, the fourth filters 32, 55 are provided at a first feed attachment of the second directional coupler of the first combiner assembly, and at a first feed attachment of the second directional coupler of the second combiner assembly, respectively.

However, it should be kept in mind that the invention is also applicable to cases where a combiner is needed for only one radio base station, for example in the case of a GSM combiner.

Figure 10:
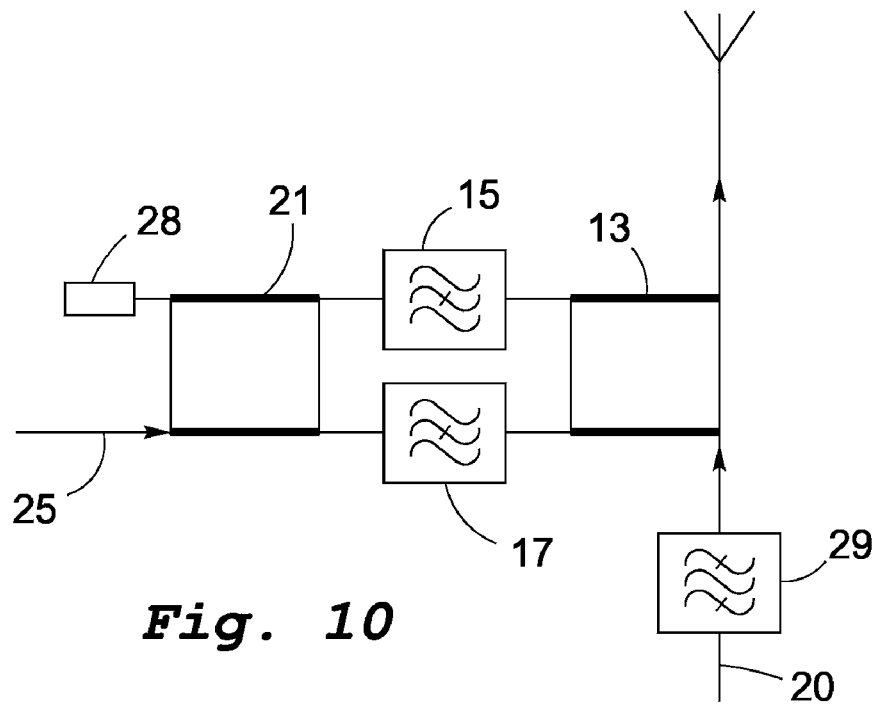
FIGS. 10 and 11 show sketches of solutions according to further embodiments of the invention.

FIG. 10 shows a filter combiner according to a further embodiment of the invention, based on the arrangement in FIG. 3. Similar to the embodiment shown in FIG. 3a, the filter combiner comprises a first hybrid 13, a second hybrid 21, a first filter 15, a second filter 17, a load 28, and a third filter 29, arranged in relation to each other as in FIG. 3a. Differing from the embodiment in FIG. 3a, the first and second filters 15, 17 are band reject filters, and the third filter 29 is a bandpass filter. The first, second, and third filters are tuned to a band between the frequencies f1 and f2. The result is that the first signal branch 20 becomes a TX branch with frequencies f1 to f2, and the second signal 25 branch becomes a fullband TX/RX branch, excluding frequencies between f1 and f2.

The arrangement in FIG. 10 results in the combiner having two band reject filters 15, 17 and one bandpass filter 29. This is an advantage, since, as is known in the art, band reject filters are often less complex and easier to tune. Also, the two parallel filters 15 and 17 in FIG. 3a and in FIG. 10 should preferably be equal. A simple design, as in the case of band reject filters, makes it easier to provide equal filters, and therefore the embodiment in FIG. 10 is simpler to produce.

Figure 11:
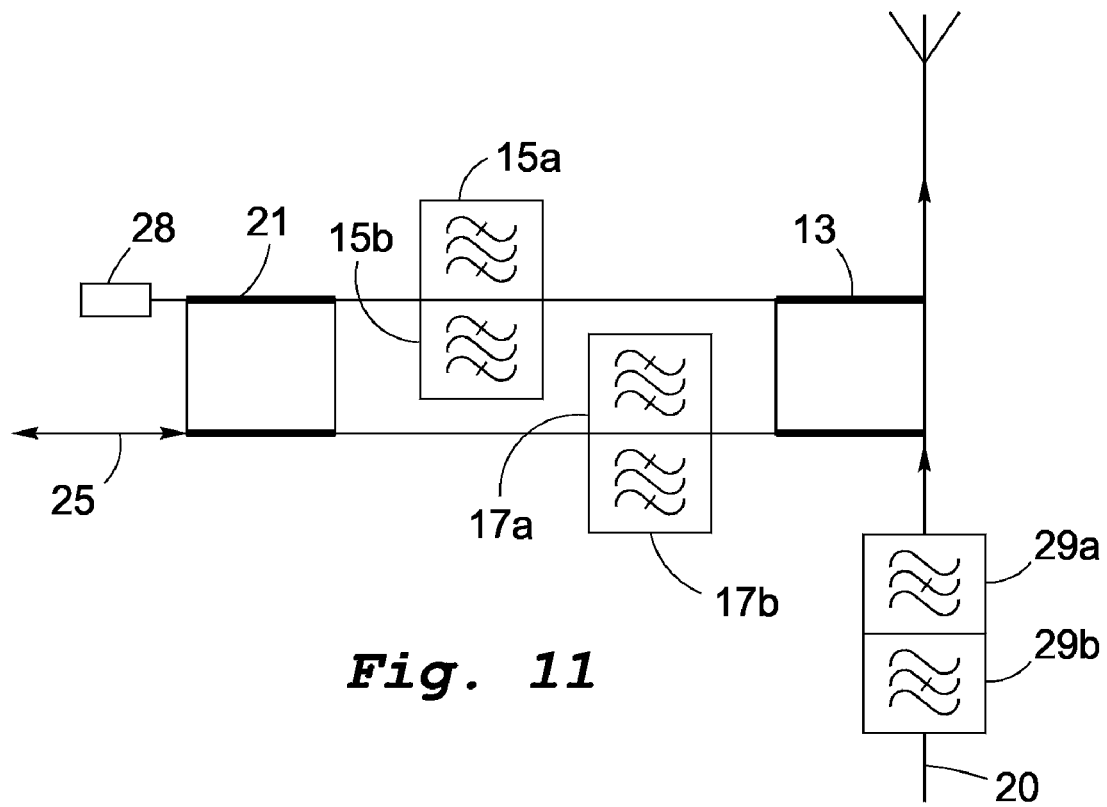

FIG. 11 shows a filter combiner according to another embodiment of the invention. Similar to the embodiment shown in FIG. 3a, the filter combiner comprises a first hybrid 13, a second hybrid 21, and a load 28, arranged in relation to each other as in FIG. 3a. Differing from the embodiment in FIG. 3a, there are two first filters 15a, 15b, two second filters 17a, 17b, and two third filters 29a, 29b. The first and second filters 15a, 15b, 17a, 17b are bandpass filters, and the third filters 29a, 29b are band reject filters. One of the first filters 15a, one of the second filters 17a, and one of the third filters 29a are tuned to a band between the RX frequencies f1RX and f2RX. The remaining of the first filters 15b, the remaining of the second filters 1 7b, and the remaining of the third filters 29b are tuned to a band between the TX frequencies f1TX and f2TX.

Figure 12:
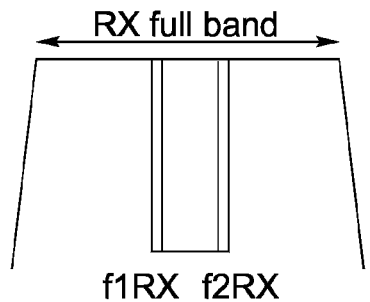
FIGS. 12 and 13 show diagrams of the frequency distribution of the signals in the embodiment in FIG. 11, FIGS. 14, 15 and 16 show sketches of solutions according to further embodiments of the invention.
Figure 13:
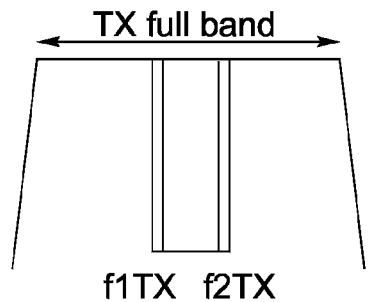

As a result the first signal branch 20 is a RX fullband branch excluding frequencies between f1RX and f2RX (see FIG. 12), and a TX fullband branch excluding frequencies between f1TX and f2TX (see FIG. 13). The second signal branch 25 is a RX branch including frequencies between f1RX and f2RX (see FIG. 12), and a TX branch including frequencies between f1TX and f2TX (see FIG. 13).

Figure 14:
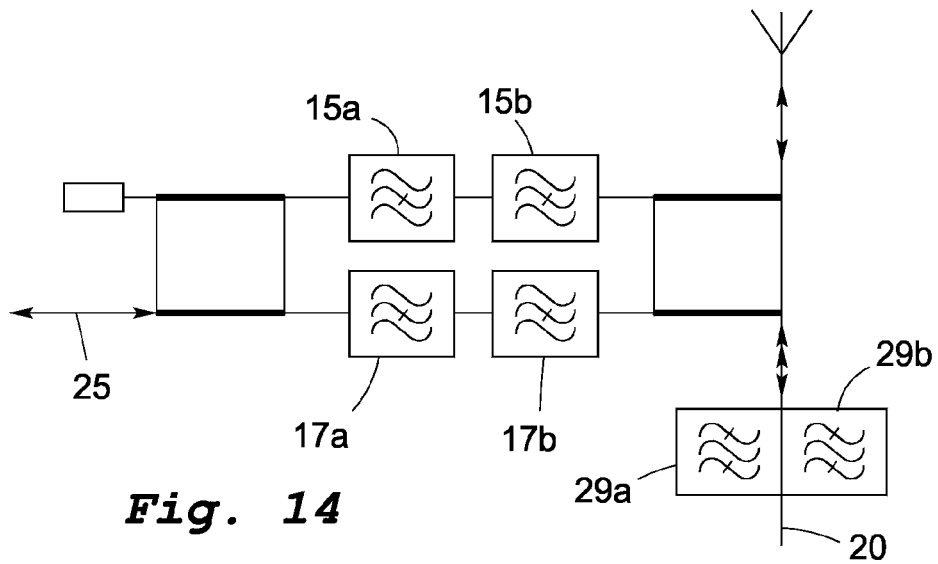

FIG. 14 shows a filter combiner according to yet another embodiment of the invention, which is similar to the embodiment shown in FIG. 11. Differing from the embodiment in FIG. 11, the first and second filters 15a, 15b, 17a, 17b are band reject filters, and the third filters 29a, 29b are bandpass filters. One of the first filters 15a, one of the second filters 17a, and one of the third filters 29a are tuned to a band between the RX frequencies f1RX and f2RX. The remaining of the first filters 15b, the remaining of the second filters 17b, and the remaining of the third filters 29b are tuned to a band between the TX frequencies f1TX and f2TX.

As a result the first signal branch 20 is a RX branch including frequencies between f1RX and f2RX (see FIG. 12), and a TX branch including frequencies between f1TX and f2TX (see FIG. 13). The second signal branch 25 is a RX fullband branch excluding frequencies between f1RX and f2RX (see FIG. 12), and a TX fullband branch excluding frequencies between f1TX and f2TX (see FIG. 13).

Figure 15:
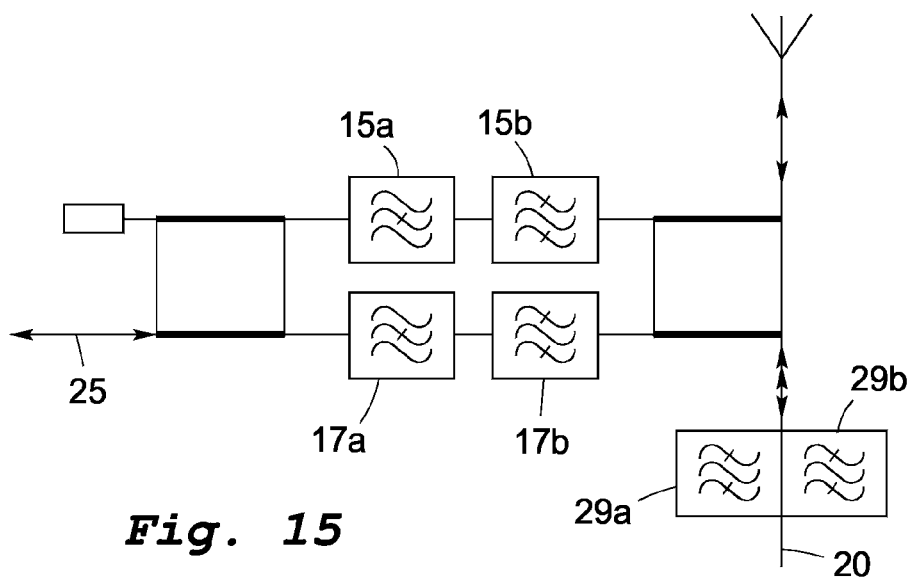

FIG. 15 shows a filter combiner according to yet a further embodiment of the invention, which is similar to the embodiments shown in FIGS. 11 and 14. Differing from the embodiments in FIGS. 11 and 14, one of the first filters 15a and one of the second filters 17a are band reject filters tuned to a band between the TX frequencies f1TX and f2TX. The remaining of the first filters 15b and the remaining of the second filters 17b are bandpass filters tuned to the TX fullband. This will exclude from the second signal branch 25 all RX frequencies as well as TX frequencies between f1TX and f2TX. One of the third filters 29a is a bandpass filter tuned to a band between the TX frequencies f1TX and f2TX, and the remaining of the third filters 29b is a bandpass filter tuned to the RX fullband.

As a result the first signal branch 20 is a RX fullband branch, and a TX branch including frequencies between f1TX and f2TX (see FIG. 13). In other words, this embodiment has the advantage that the first signal branch 20 can be used as a part band port for TX signals, while serving as a fullband port for RX signals. The second signal branch 25 is a TX fullband branch excluding frequencies between f1TX and f2TX (see FIG. 13).

Figure 16:
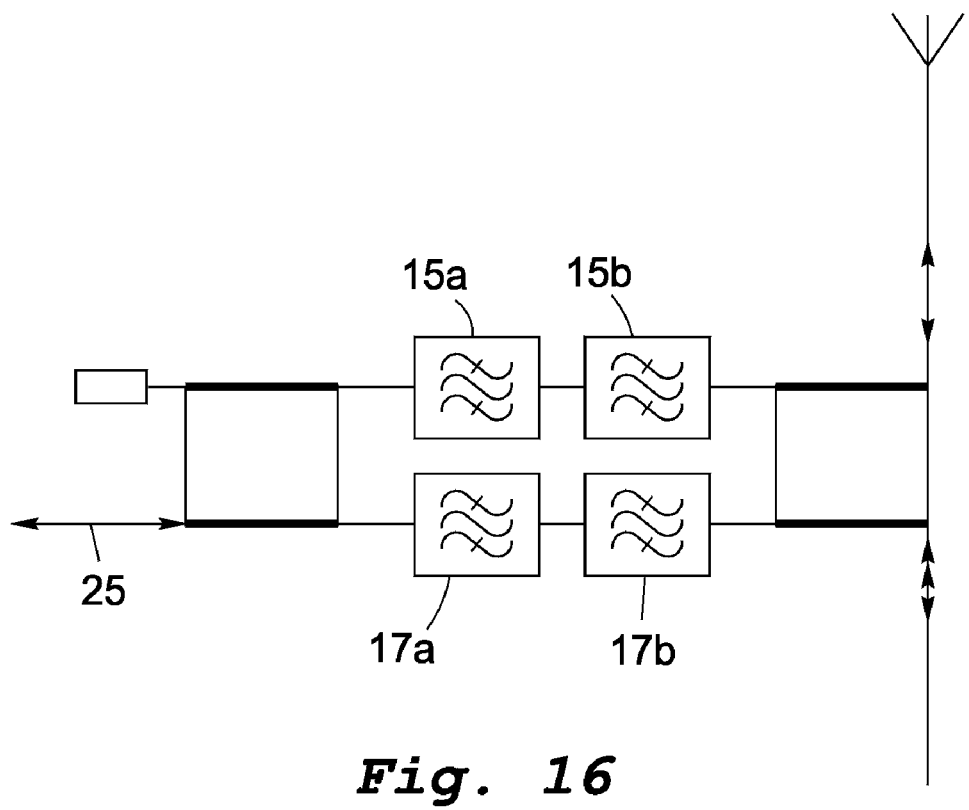

FIG. 16 shows a filter combiner according to a further embodiment of the invention, similar to the embodiment shown in FIG. 11. As in the embodiment in FIG. 11, the first and second filters 15a, 15b, 17a, 17b are bandpass filters. Differing from the embodiment in FIG. 11, one of the first filters 15a and one of the second filters 17a are tuned to a band between a first and a second TX frequency f1, f2, the second frequency f2 being higher than the first frequency f1. The remaining of the first filters 15b and the remaining of the second filters 17b are tuned to a band between a third and a fourth TX frequency f3, f4, the fourth frequency f4 being higher than the third frequency f3.

Figure 17:
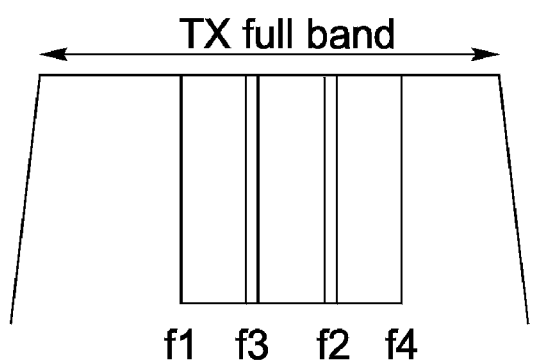
FIG. 17 shows a diagram of the frequency distribution of the signals in the embodiment in FIG. 16.

As can be seen in FIG. 17, the frequency intervals f1-f2 and f3-f4 are overlapping. Thereby, the bandwidth of the second branch 25 can be adjusted. The presence of both first filters 15a, 15b and both second filters 17a, 17b will result in a bandwidth between f2 and f3. As stated above, in combiners according to the invention, transmission line lengths are not critical. Simply by adjusting the center frequencies of the filters 15a, 15b, 17a, 17b in FIG. 16, the bandwidth f2 and f3 can be adjusted. This should be seen in view of it being, as is known in the art, very complicated to make a filter with variable bandwidth. It is much easier to adjust the center frequency of a filter. Thus, the embodiment in FIG. 16 provides an effective solution to the problem of providing a variable bandwidth in a combiner. The filters tuned to frequencies between f1 and f2 can be tuned independently of the filters tuned to frequencies between f3 and f4, or alternatively, they can be tuned in conjunction with each other. Also, if one of the first filters 15a, 15b and the corresponding second filter 17a, 17b are removed, the resulting bandwidth will be between f1 and f2, or f3 and f4, depending on which of the first filters and the second filters are removed.

The arrangement described with reference to FIGS. 16 and 17, with filters having overlapping frequency intervals, can of course alternatively be used for RX signals.

Figure 18:
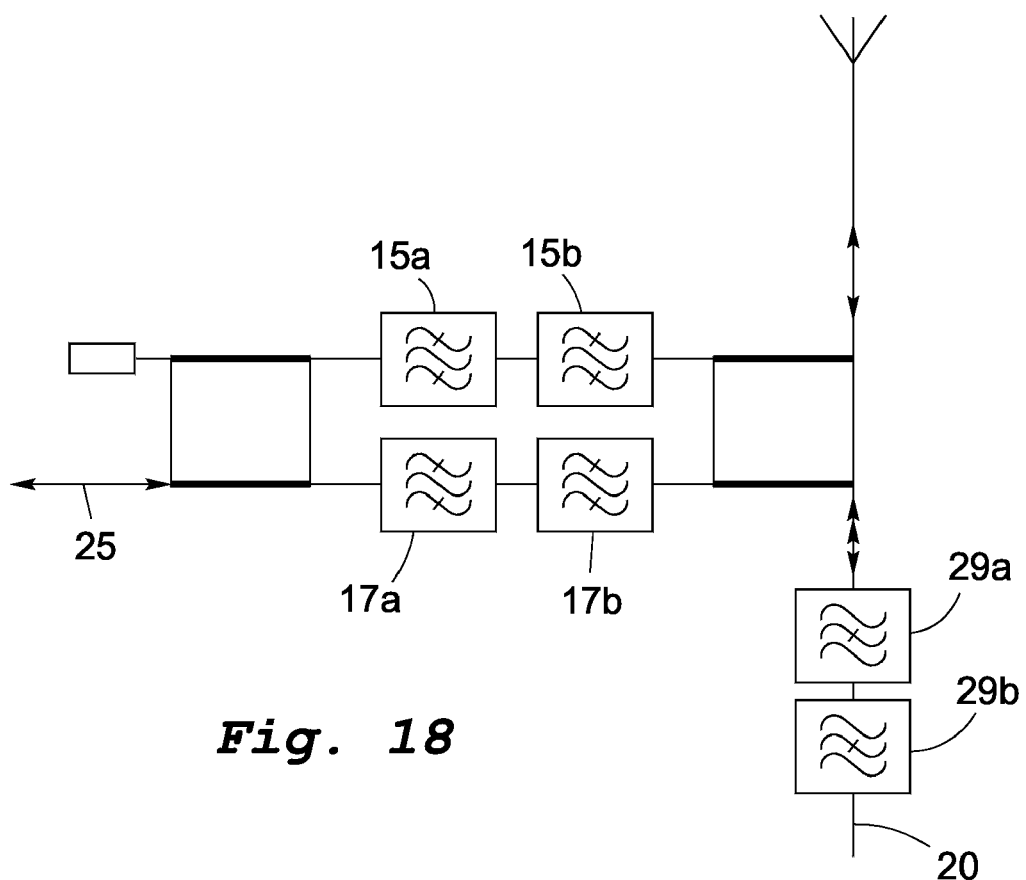
FIG. 18 shows a sketch of a solution according to another embodiment of the invention.

FIG. 18 shows a filter combiner according to yet another embodiment of the invention, similar to the embodiment shown in FIG. 16. Thus, at a second branch 25, first and second filters 15a, 15b, 17a, 17b are bandpass filters, whereby one of the first filters 15a and one of the second filters 17a are tuned to a band between the TX frequencies f1 and f2, and the remaining of the first filters 15b and the remaining of the second filters 17b are tuned to a band between the TX frequencies f3 and f4.

Figure 19:
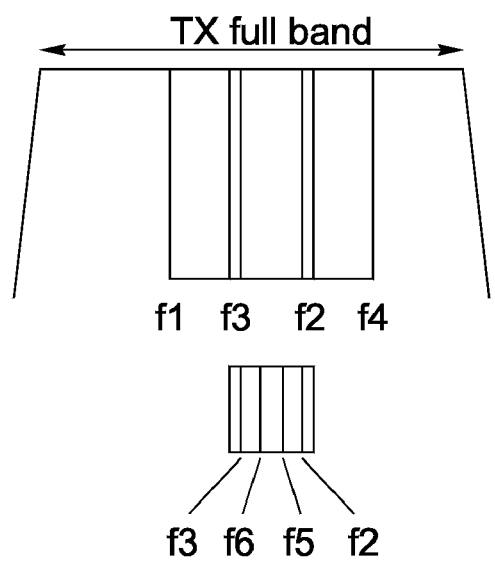
FIG. 19 shows a diagram of the frequency distribution of the signals in the embodiment in FIG. 18.

Differing from the embodiment in FIG. 16, two band reject filters 29a, 29b are provided on the first branch 20. Referring to FIG. 19, one of the band reject filters 29a is tuned to frequencies between f3 and f5, f5 being higher than f3, and the remaining one of the band reject filters 29b is tuned to frequencies between f6 and f2, f2 being higher than f6. f6 and f5 are located between f3 and f2 and f5 is higher than f6. The band reject filters 29a, 29b are arranged so that the frequency intervals f3 to f5 and f6 to f2 overlap. Thereby, frequencies between f3 and f2, i.e. the same interval admitted at the second branch 25, will be rejected at the first branch 20. This will increase the isolation to the first branch 20. Further, the embodiment in FIG. 18 has the advantage that the bandwidth of the combination of band reject filters 29a, 29b can be adjusted.

Figure 20:
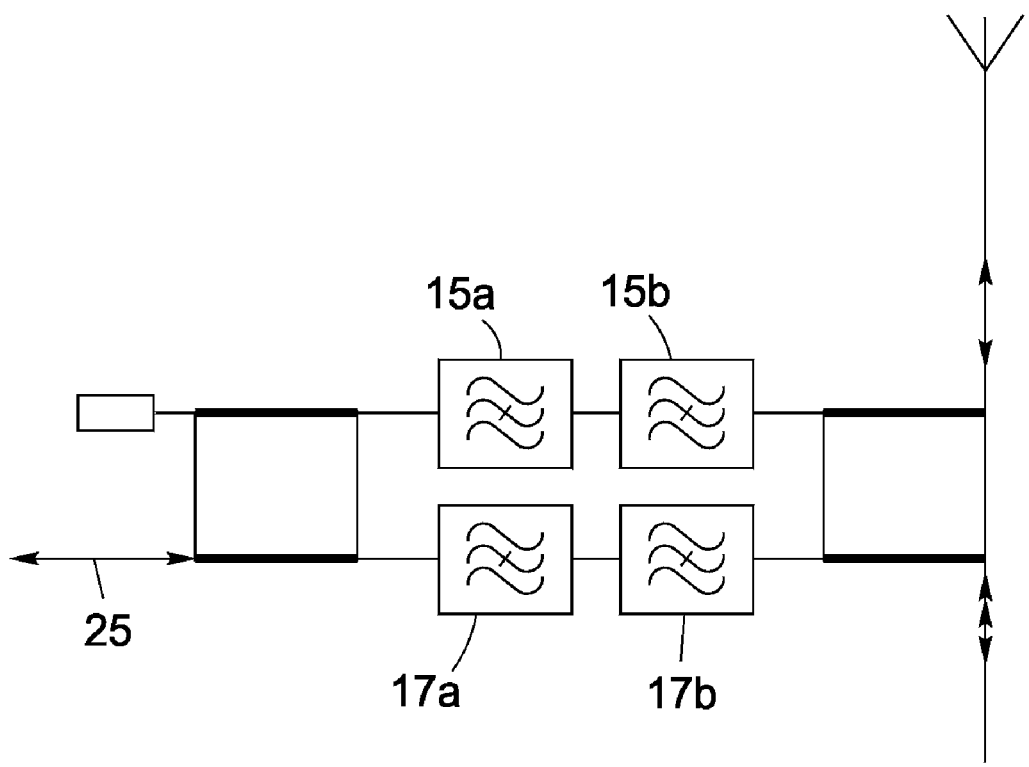
FIG. 20 shows a sketch of a solution according to another embodiment of the invention.
Figure 21:
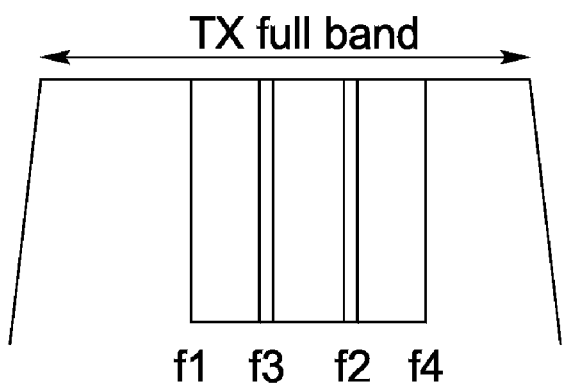
FIG. 21 shows a diagram of the frequency distribution of the signals in the embodiment in FIG. 20.

FIG. 20 shows a filter combiner according to a further embodiment of the invention, similar to the embodiment shown in FIG. 16, but differing in that the first and second filters 15a, 15b, 17a, 17b are band reject filters. One of the first filters 15a and one of the second filters 17a are tuned to a band between a first and a second TX frequency f1, f2, the second frequency f2 being higher than the first frequency f1. The remaining of the first filters 15b and the remaining of the second filters 17b are tuned to a band between a third and a fourth TX frequency f3, f4, the fourth frequency f4 being higher than the third frequency f3. As can be seen in FIG. 21, the frequency intervals f1-f2 and f3-f4 are overlapping. Thereby, the bandwidth of the second branch 25 can be adjusted. The presence of both first filters 15a, 15b and both second filters 17a, 17b will result in a fullband at the second branch 25 excluding the frequencies between f1 and f4.

Figure 22:
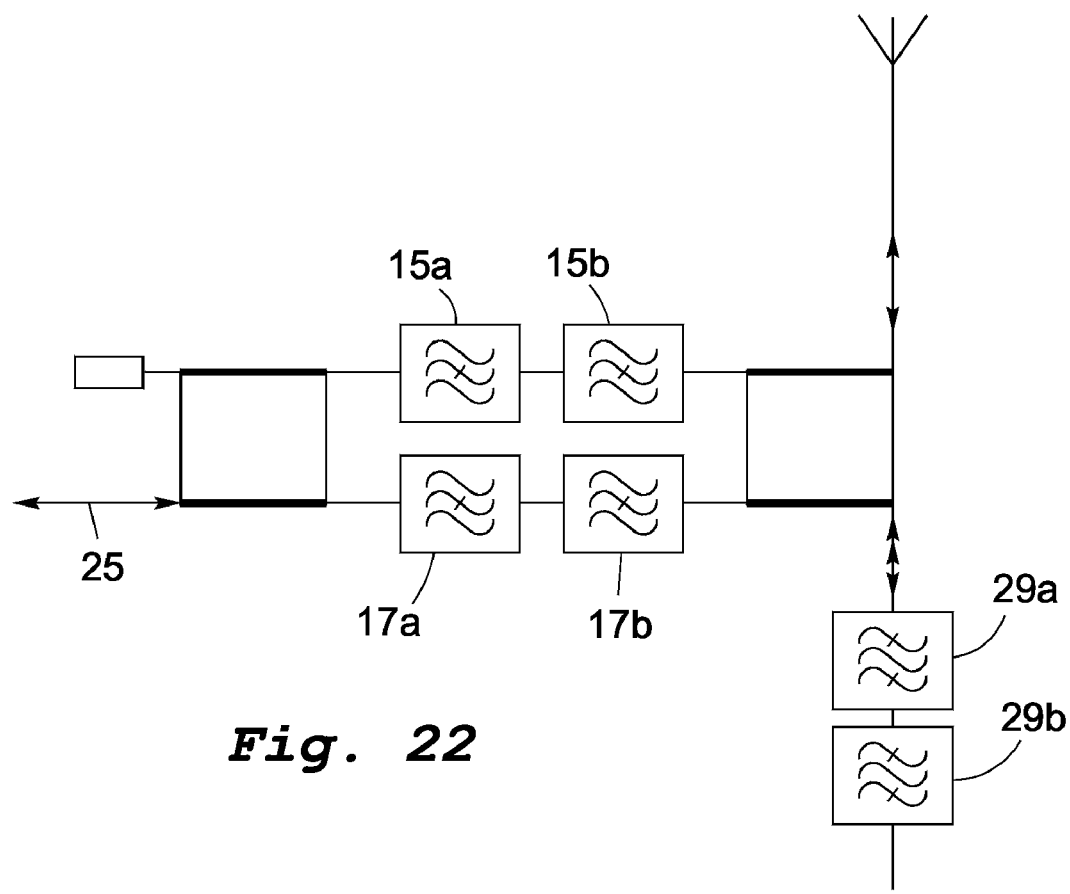
FIG. 22 shows a sketch of a solution according to a further embodiment of the invention.

FIG. 22 shows a filter combiner according to yet a further embodiment of the invention, similar to the embodiment shown in FIG. 20. Thus, at a second branch 25, first and second filters 15a, 15b, 17a, 17b are band reject filters, whereby one of the first filters 15a and one of the second filters 17a are tuned to a band between the TX frequencies f1 and f2, and the remaining of the first filters 15b and the remaining of the second filters 17b are tuned to a band between the TX frequencies f3 and f4.

Figure 23:
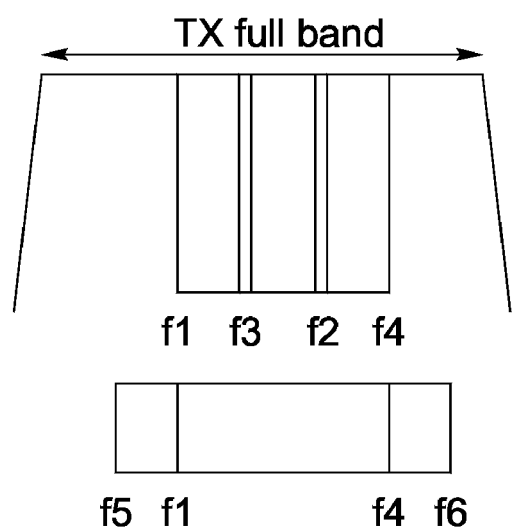
FIG. 23 shows a diagram of the frequency distribution of the signals in the embodiment in FIG. 18.

Differing from the embodiment in FIG. 20, two band pass filters 29a, 29b are provided on the first branch 20. Referring to FIG. 23, one of the band pass filters 29a is tuned to frequencies between f5 and f4, f4 being higher than f5, and the remaining one of the band pass filters 29b is tuned to frequencies between f1 and f6, f6 being higher than f1. The band reject filters 29a, 29b are arranged so that the frequency intervals f5 to f4 and f1 to f6 overlap. Thereby, frequencies between f1 and f4, i.e. the same interval rejected at the second branch 25, will be admitted at the first branch 20.

Figure 24:
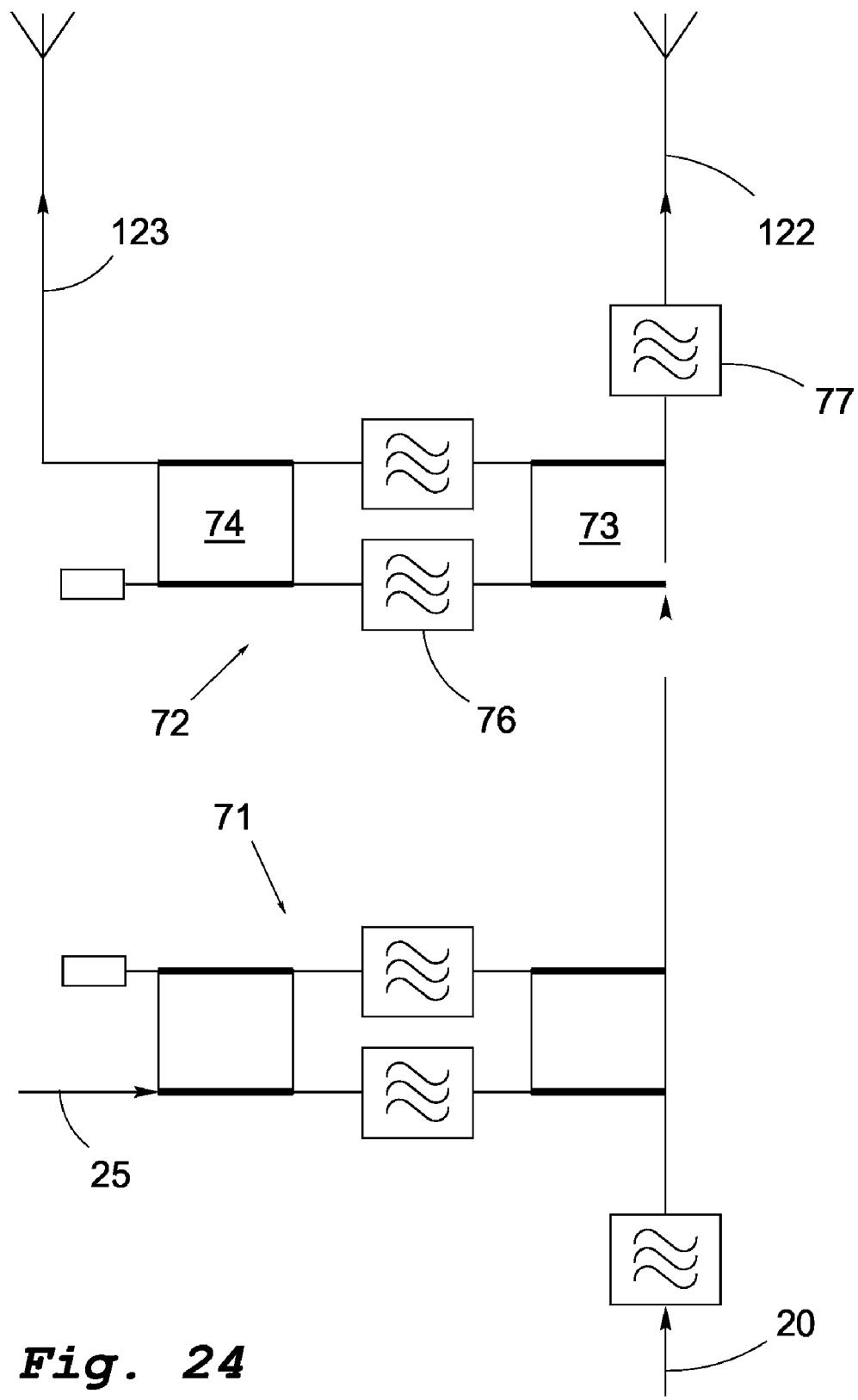
FIG. 24 shows a sketch of a solution according to yet a further embodiment of the invention.

FIG. 24 shown yet another embodiment of the invention. A filter combiner comprises a combiner assembly 71 and a splitter assembly 72. The combiner assembly 71 is arranged as described above with reference to FIG. 3a, and connected to a first 20 and a second 25 signal branch. Of course, alternatively the combiner assembly can be arranged with an inverted arrangement of bandpass and band reject filters, as described above with reference to FIG. 10.

The splitter assembly 72 comprises a first directional coupler in the form of a first hybrid 73 and a second directional coupler in the form of a second hybrid 74, both connected to a first filter 75 and a second filter 76, both bandpass filters tuned to the frequency band f1-f2. The first hybrid 73 is connected to a first antenna branch 122 via a third filter 77, which is a band reject filter tuned to the frequency band f1-f2. The first hybrid 73 is also connected to the first hybrid of the combiner assembly 71. Thus, the first directional coupler is adapted to be connected to at least one signal branch 20, 25. The second hybrid 74 is connected to a second antenna branch 123.

Thereby, the first antenna branch 122 will receive TX fullband signals except for frequencies in the interval f1 to f2, and the second antenna branch 123 will receive TX frequencies in the interval f1 to f2.

Of course, alternatively, the first filter 75 and the second filter 76 can be band reject filters tuned to the frequency band f1-f2, and the third filter 77 can be a band pass filter tuned to the frequency band f1-f2, so that the first antenna branch 122 will receive TX frequencies in the interval f1 to f2, and the second antenna branch 123 will receive TX fullband signals except for frequencies in the interval f1 to f2.

The embodiment described with reference to FIG. 24 shows that the inventive concept can be used to split signals into two antennas. The splitter assembly 72 can be seen as an "inverted" version of the embodiment in FIG. 3a or in FIG. 10. Of course, it can also be modified so as to correspond to, be an "inverted" version of the filter combiners described above with reference to FIG. 3b, 3c, 11, 14, 15, 16, 18, 20 or 22.

In all embodiments described above, as alternatives to hybrides, other types of directional coupler can be used, for example, so called Magic T:s.

The invention claimed is:

1. A filter combiner, for mobile communications applications, adapted to be connected directly or via other components to an antenna, comprising:
    a first directional coupler, connected to at least one first filter and at least one second filter, and adapted to be connected to an antenna branch, and to a first signal branch via at least one third filter;
    a second directional coupler, connected to the at least one first filter and the at least one second filter, and adapted to be connected to a second signal branch
    wherein each of the filters is one of a band pass filter type or a band reject filter type;
    wherein the at least one first filter and the at least one second filter are of the same type whereas the at least one third filter is of the other type; and,
    wherein the at least one first, second and third filters are all tuned to a band between substantially the same frequencies.

2. The filter combiner according to claim 1, wherein the first directional coupler and the second directional coupler are hybrids.

3. The filter combiner according to claim 1, comprising a fourth filter at the second directional coupler.

4. The filter combiner according to claim 3, wherein the first signal branch is connected to a first radio base station, which in turn is connected to the fourth filter, the second signal branch being connected to a second radio base station.

5. The filter combiner according to claim 1, wherein the first directional coupler, the first filter, the second filter, the second directional coupler, and the third filter, are included in a first combiner assembly, the filter combiner further comprising a second combiner assembly comprising:
    a first directional coupler connected to at least one first filter, at least one second filter, and at least one third filter, and adapted to be connected to the antenna branch;
    a second directional coupler connected to the at least one first filter and the at least one second filter, and adapted to be connected to a third signal branch,
    the first directional coupler of the first combiner assembly being connected to the at least one third filter of the second combiner assembly.

6. The filter combiner according to claim 5, further comprising:
    a fourth filter at the second directional coupler of the first combiner assembly; and,
    a fourth filter at the second directional coupler of the second combiner assembly;
    wherein the first signal branch is connected to a first radio base station, which in turn is connected to the fourth filter of the first combiner assembly, and the second signal branch being connected to a second radio base station; and,
    wherein the first radio base station is connected to the fourth filter of the second combiner assembly, the third signal branch being connected to a third radio base station.

7. The filter combiner according to claim 1, wherein the first filter is implemented as a combination of two first filters, the second filter is implemented as a combination of two second filters, and the third filter is implemented as a combination of two third filters.

8. The filter combiner according to claim 7, wherein the two first filters and the two second filters are bandpass filters, and the two third filters are bandreject filters, one of the first filters, one of the second filters, and one of the third filters being tuned to a band between two RX frequencies, and another of the first filters, another of the second filters, and another of the third filters being tuned to a band between two TX frequencies.

9. The filter combiner according to claim 7, wherein the two first filters and the two second filters are bandreject filters, and the two third filters are bandpass filters, one of the first filters, one of the second filters, and one of the third filters being tuned to a band between two RX frequencies, and another of the first filters, another of the second filters, and another of the third filters being tuned to a band between two TX frequencies.

10. The filter combiner according to claim 7, wherein one of the first filters and one of the second filters are band reject filters tuned to a band between two TX frequencies, and another of the first filters and another of the second filters are bandpass filters tuned to a TX fullband, in addition to which one of the third filters is a bandpass filter tuned to a band between the two TX frequencies, and another of the third filters is a bandpass filter tuned to the RX fullband.

11. The filter combiner according to claim 7, wherein the first filters and the second filters are bandpass filters, one of the first filters and one of the second filters being tuned to a band between a first and a second TX frequency, and another of the first filters and another of the second filters being tuned to a band between a third and a fourth TX frequency, the interval between the first and the second TX frequency and the interval between the third and the fourth TX frequency overlapping each other at least partially,
    the third filters being band reject filters, one of the third filters being tuned to a band between the third frequency and a fifth frequency, and another of the band reject filters being tuned to a band between a sixth frequency and the second frequency, the interval between the third frequency and the fifth frequency, and the interval between the sixth frequency and the second frequency overlapping each other at least partially.

12. The filter combiner according to claim 7, wherein
the first filters and the second filters are band reject filters, one of the first filters and one of the second filters being tuned to a band between a first and a second TX frequency, and another of the first filters and another of the second filters being tuned to a band between a third and a fourth TX frequency, the interval between the first and the second TX frequency and the interval between the third and the fourth TX frequency overlapping each other at least partially, the third filters being bandpass filters, one of the third filters being tuned to a band between a fifth frequency and the fourth frequency, and another one of the band reject filters being tuned to a band between the first frequency and a sixth frequency, the interval between the fifth frequency and the fourth frequency, and the interval between the first frequency and the sixth frequency overlapping each other at least partially.

13. A splitter assembly comprising: a first directional coupler and a second directional coupler, both connected to at least one first filter and at least one second filter, the first directional coupler being adapted to be connected to a first antenna branch via a third filter, and the second directional coupler being adapted to be connected to a second antenna branch, each of the filters being one of a band pass filter type or a band reject filter type, the at least one first filter and the at least one second filter being of the same type whereas the at least one third filter is of the other type, the at least one first, second and third filters all being tuned to a band between substantially the same frequencies.

* * * * *